(12) United States Patent
Nishino et al.

(10) Patent No.: US 9,748,155 B2
(45) Date of Patent: Aug. 29, 2017

(54) PRINTED CIRCUIT BOARD

(71) Applicant: CANON KABUSHIKI KAISHA, Tokyo (JP)

(72) Inventors: Tatsuo Nishino, Yokohama (JP); Kiyoshi Sekiguchi, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 71 days.

(21) Appl. No.: 14/897,127

(22) PCT Filed: Jul. 9, 2014

(86) PCT No.: PCT/JP2014/068844
§ 371 (c)(1),
(2) Date: Dec. 9, 2015

(87) PCT Pub. No.: WO2015/008768
PCT Pub. Date: Jan. 22, 2015

(65) Prior Publication Data
US 2016/0133532 A1    May 12, 2016

(30) Foreign Application Priority Data
Jul. 18, 2013 (JP) ................. 2013-149602

(51) Int. Cl.
*H05K 1/14*    (2006.01)
*H01L 23/13*    (2006.01)
(Continued)

(52) U.S. Cl.
CPC ........... *H01L 23/13* (2013.01); *H04B 15/005* (2013.01); *H05K 1/0215* (2013.01);
(Continued)

(58) Field of Classification Search
CPC ............ H05K 1/0298; H05K 2201/20; H05K 1/0218; H05K 2201/09036;
(Continued)

(56) References Cited

U.S. PATENT DOCUMENTS

| 6,198,362 B1 * | 3/2001 | Harada ................ H05K 1/0231 333/12 |
| 8,174,843 B2 | 5/2012 | Hayashi |
| 2007/0136618 A1 * | 6/2007 | Ohsaka .................. G06F 1/188 713/323 |

FOREIGN PATENT DOCUMENTS

| JP | S61-007684 A | 1/1986 |
| JP | 2002-252468 A | 9/2002 |

(Continued)

OTHER PUBLICATIONS

PCT International Preliminary Report on Patentability dated Jan. 28, 2016 in PCT/JP2014/068844.
(Continued)

*Primary Examiner* — Binh Tran
(74) *Attorney, Agent, or Firm* — Fitzpatrick, Cella, Harper & Scinto

(57) ABSTRACT

A printed wiring board includes a power supply conductor pattern arranged on one conductor layer, one ground conductor pattern arranged on the one conductor layer, and another ground conductor pattern arranged on the another conductor layer so as to be opposed to the power supply conductor pattern. The power supply conductor pattern includes a power supply pad on which a terminal of a capacitor is to be bonded. The one ground conductor pattern includes a ground pad on which another terminal of the capacitor is to be bonded. A slit is formed in the another ground conductor pattern so as to pass through a projection portion defined by projecting the power supply pad onto the another ground conductor pattern and divide a projection
(Continued)

portion defined by projecting the power supply conductor pattern onto the another ground conductor pattern.

19 Claims, 12 Drawing Sheets

(51) Int. Cl.
| | |
|---|---|
| H04B 15/00 | (2006.01) |
| H05K 1/11 | (2006.01) |
| H05K 1/18 | (2006.01) |
| H05K 7/14 | (2006.01) |
| H05K 7/18 | (2006.01) |
| H05K 9/00 | (2006.01) |
| H05K 1/02 | (2006.01) |
| H05K 3/34 | (2006.01) |

(52) U.S. Cl.
CPC ........... *H05K 1/0298* (2013.01); *H05K 1/111* (2013.01); *H05K 1/181* (2013.01); *H01L 2924/15311* (2013.01); *H05K 1/0224* (2013.01); *H05K 1/0225* (2013.01); *H05K 1/0231* (2013.01); *H05K 3/3442* (2013.01); *H05K 9/0039* (2013.01); *H05K 2201/09663* (2013.01); *Y02P 70/611* (2015.11)

(58) Field of Classification Search
CPC ..... H05K 2201/0929; H05K 2201/093; H05K 2201/09327; H05K 2201/09354; H05K 2201/09345; H05K 1/0263; H05K 1/0224; H05K 1/0225; H05K 2201/09681; H05K 9/0039
USPC ......... 361/748, 750, 761, 794, 799; 174/250
See application file for complete search history.

(56) References Cited

FOREIGN PATENT DOCUMENTS

| | | |
|---|---|---|
| JP | 2009-010229 A | 1/2009 |
| JP | 2009-027140 A | 2/2009 |

OTHER PUBLICATIONS

Japanese Office Action issued Jun. 27, 2017 during prosecution of related Japanese application No. 2013-149602 (with whole English translation). (NOTE: All references listed in OA have previously been cited in this case).

* cited by examiner

PRINTED CIRCUIT BOARD

This application is a national stage application under 35 U.S.C. §371 of International Application No. PCT/JP2014/068844, having an International filing date of Jul. 9, 2014, which claims priority to Japan 2013-149602, filed on Jul. 18, 2013, the contents of each of which are incorporated by reference as if set forth in full herein.

TECHNICAL FIELD

The present invention relates to a printed circuit board configured to suppress propagation of high-frequency power supply noise generated from a semiconductor device mounted on a printed wiring board to another portion on the printed wiring board.

BACKGROUND ART

In recent years, electronic devices are becoming more and more multi-functionalized, downsized, and digitalized. In such circumstances, an electronic device exhibits its functions by a combination of a large number of semiconductor devices. The demand for advanced multi-functionality of semiconductor devices makes their processes complicated, which promotes an increase in operating speed. In order to respond to the demands for high-speed operation and downsizing of semiconductor devices, the semiconductor manufacturing process becomes finer and the operating voltage becomes lower, but the current tends to increase. Along with the decrease in operating voltage, a technology of suppressing fluctuations in power supply potential has become essential.

Measures taken to suppress the fluctuations in power supply potential are to arrange a bypass capacitor very close to a semiconductor device and to connect by thick and short wiring or a large number of vias. The purpose is to reduce an inductance component of power supply wiring. The inductance of the power supply wiring adversely affects the fluctuations in power supply potential. This is because counter-electromotive force is generated by a current flowing in the power supply wiring based on the inductance component of the power supply wiring, to thereby cause the fluctuations in the power supply potential. In an electronic device, a large number of such semiconductor devices capable of performing high-speed operation are mounted on a printed wiring board.

In order to realize downsizing, the semiconductor devices and the bypass capacitor are arranged very close to one another. The power supply wiring to be wired is thick and short in order to achieve the low inductance, but the power supply potential may fluctuate in the semiconductor device to no small extent. It is common practice that the fluctuations in the power supply potential in the operating semiconductor device itself are controlled by the low inductance. In the electronic device, another semiconductor device arranged in the vicinity of the semiconductor device also operates at high speed with a similar low voltage. As the operating voltage becomes lower, concern is growing that the fluctuations in the power supply potential generated from one semiconductor device itself may adversely affect another semiconductor device to cause a malfunction or the like.

As the countermeasure, in PTL 1, in order to improve an effect of suppressing high-frequency power supply noise superimposed on a power supply system, there is proposed a technology relating to a power supply noise filter structure of a printed wiring board having a capacitor mounted thereon. In PTL 1, power supply wiring is divided into two parts, and one of the two terminals of the capacitor is connected across the two parts of the power supply wiring while the other terminal is connected to ground wiring. In this manner, bypass performance of the capacitor is improved.

CITATION LIST

Patent Literature

PTL 1: Japanese Patent Application Laid-Open No. 2009-10229

SUMMARY OF INVENTION

Technical Problem

However, even when the power supply wiring is divided into two parts as disclosed in Patent Literature 1, one power supply wiring and the other power supply wiring are electrically connected to each other through the terminal of the capacitor and the solder used to bond the terminal of the capacitor on the power supply wiring. Thus, power supply noise may flow from one power supply wiring to the other power supply wiring through those portions. Then, a bonding portion of the power supply wiring and the capacitor is opposed to the ground wiring through intermediation of an insulator layer, and hence a return current is liable to flow in the ground wiring in the direction reverse to that of a high-frequency noise current flowing in the power supply wiring, with the result that an effective inductance is low. Thus, the propagation suppression effect for power supply noise is low, and further improvements have been required.

It is therefore an object of the present invention to provide a printed circuit board configured to enhance a bypass effect of a capacitor so as to suppress propagation of high-frequency power supply noise.

Solution to Problem

A printed circuit board according to one embodiment of the present invention includes: a semiconductor device including a power supply terminal and a ground terminal; a capacitor including a first terminal and a second terminal; and a printed wiring board having the semiconductor device and the capacitor mounted thereon, the printed wiring board including a first conductor layer and a second conductor layer that are laminated through intermediation of an insulator layer. The printed wiring board includes: a power supply conductor pattern that is arranged on the first conductor layer and is electrically connected to the power supply terminal of the semiconductor device; a first ground conductor pattern that is arranged on the first conductor layer so as to be spaced apart from the power supply conductor pattern and is electrically connected to the ground terminal of the semiconductor device; and a second ground conductor pattern that is arranged on the second conductor layer so as to be opposed to the power supply conductor pattern and is electrically connected to the first ground conductor pattern. The power supply conductor pattern includes a power supply pad on which the first terminal of the capacitor is to be bonded. The first ground conductor pattern includes a ground pad on which the second terminal of the capacitor is to be bonded. The second ground conductor pattern has a slit formed therein so as to pass through a projection portion defined by projecting the power supply pad onto the second ground conductor pattern and divide a projection portion defined by projecting the power supply conductor pattern onto the second ground conductor pattern.

Further features of the present invention will become apparent from the following description of exemplary embodiments with reference to the attached drawings.

Advantageous Effects of Invention

According to one embodiment of the present invention, due to the slit formed in the ground conductor pattern, a return current in response to a noise current flowing in the power supply conductor pattern is less liable to flow in the ground conductor pattern, and the inductance of the power supply conductor pattern is increased in a portion opposed to the slit. The slit is formed in the projection portion defined by projecting the power supply pad on which the first terminal of the capacitor is bonded onto the second conductor layer, and hence power supply noise is more likely to flow to the capacitor. Consequently, the power supply noise can be suppressed from passing through the power supply pad to propagate through the power supply conductor pattern.

DESCRIPTION OF EMBODIMENTS

Embodiments of the present invention are described in detail below with reference to the accompanying drawings.

First Embodiment

Figure 1:
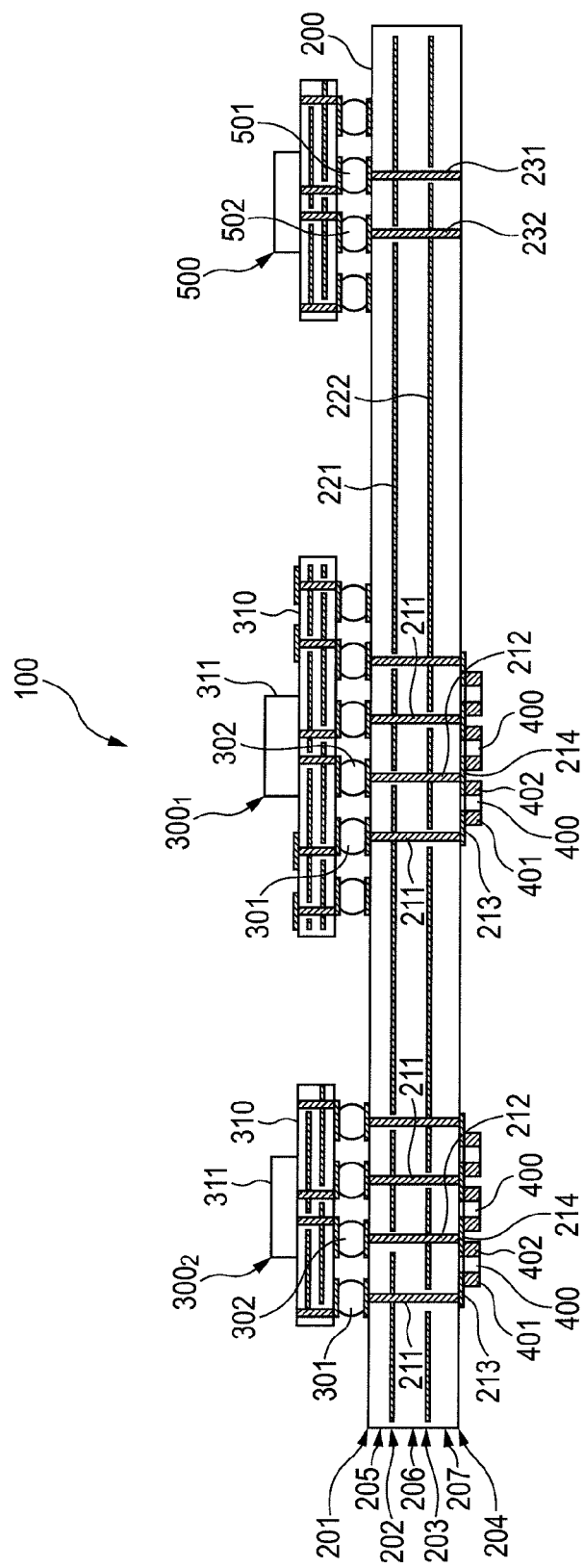
FIG. 1 is an explanatory diagram illustrating a schematic configuration of a printed circuit board according to a first embodiment of the present invention.

FIG. 1 is an explanatory diagram illustrating a schematic configuration of a printed circuit board according to a first embodiment of the present invention. A printed circuit board 100 includes a printed wiring board 200, a plurality of semiconductor packages $300_1$ and $300_2$ serving as a plurality of semiconductor devices mounted on the printed wiring board 200, and a plurality of capacitors 400 mounted on the printed wiring board 200. The printed circuit board 100 further includes a power supply circuit 500 mounted on the printed wiring board 200.

Each of the semiconductor packages $300_1$ and $300_2$ includes a power supply terminal 301 and a ground terminal 302, and operates when a DC voltage is applied between the power supply terminal 301 and the ground terminal 302. Note that, each of the semiconductor packages $300_1$ and $300_2$ includes an interposer 310 and a semiconductor element 311 mounted on the interposer 310, and the power supply terminal 301 and the ground terminal 302 are arranged on the interposer 310.

The capacitor 400 is constructed by a chip capacitor, for example. The capacitor 400 includes a terminal (electrode) 401 serving as a first terminal and a terminal (electrode) 402 serving as a second terminal.

The power supply circuit 500 includes a power supply terminal 501 and a ground terminal 502, and outputs from those terminals a DC voltage necessary for the operation of the semiconductor packages $300_1$ and $300_2$ (that is, the semiconductor elements 311).

The printed wiring board 200 is a multilayer substrate (four-layer substrate) in which a plurality of (four in the first embodiment) conductor layers 201, 202, 203, and 204 are laminated through intermediation of insulator layers 205, 206, and 207.

The printed wiring board 200 includes a power supply via conductor 211 and a ground via conductor 212 that are formed to pass through the respective layers, and a power supply conductor pattern 213 and a ground conductor pattern (first ground conductor pattern) 214 that are arranged on the conductor layer 204.

The printed wiring board 200 further includes a planar power supply conductor pattern 221 arranged on the conductor layer 202 and a planar ground conductor pattern (second ground conductor pattern) 222 arranged on the conductor layer 203.

The power supply via conductor 211 is electrically connected to the power supply conductor pattern 213 and the power supply conductor pattern 221. The ground via conductor 212 is electrically connected to the ground conductor pattern 214 and the ground conductor pattern 222.

The printed wiring board 200 further includes a power supply via conductor 231 electrically connected to the power supply conductor pattern 221 and a ground via conductor 232 electrically connected to the ground conductor pattern 222.

In the first embodiment, the semiconductor packages $300_1$ and $300_2$ and the power supply circuit 500 are mounted on, for example, the conductor layer 201, and the capacitor 400 is mounted on, for example, the conductor layer 204. Then, the capacitor 400 is arranged to be opposed to the semiconductor package $300_1$ (or the semiconductor package $300_2$) through intermediation of the printed wiring board 200.

The power supply terminal 501 of the power supply circuit 500 is electrically connected to the power supply via conductor 231, and the ground terminal 502 of the power supply circuit 500 is electrically connected to the ground via conductor 232.

The power supply terminal 301 of each of the semiconductor packages $300_1$ and $300_2$ is electrically connected to the corresponding power supply via conductor 211. The ground terminal 302 of each of the semiconductor packages $300_1$ and $300_2$ is electrically connected to the corresponding ground via conductor 212.

The terminal 401 of the capacitor 400 is electrically connected to the power supply conductor pattern 213, and the terminal 402 of the capacitor 400 is electrically connected to the ground conductor pattern 214.

Thus, the power supply terminal 301 of each of the semiconductor packages $300_1$ and $300_2$ is electrically connected to the power supply terminal 501 of the power supply circuit 500 through the power supply via conductor 211, the power supply conductor pattern 221, the power supply via conductor 231, and the like. The ground terminal 302 of each of the semiconductor packages $300_1$ and $300_2$ is electrically connected to the ground terminal 502 of the power supply circuit 500 through the ground via conductor 212, the ground conductor pattern 222, the ground via conductor 232, and the like. In this manner, each of the semiconductor packages $300_1$ and $300_2$ can operate by being applied with a DC voltage from the power supply circuit 500.

Note that, the power supply terminals 301 of the respective semiconductor packages $300_1$ and $300_2$ are electrically connected to each other through the respective power supply via conductors 211 and the power supply conductor pattern 221. Similarly, the ground terminals 302 of the respective semiconductor packages $300_1$ and $300_2$ are electrically connected to each other through the respective ground via conductors 212 and the ground conductor pattern 222.

The terminal 401 of the capacitor 400 is electrically connected to the power supply terminal 301 of the semiconductor package $300_1$ (or the semiconductor package $300_2$) through the power supply conductor pattern 213, the power supply via conductor 211, and the like. The terminal 402 of the capacitor 400 is electrically connected to the ground terminal 302 of the semiconductor package $300_1$ (or the semiconductor package $300_2$) through the ground conductor pattern 214, the ground via conductor 212, and the like. Thus, the capacitor 400 functions as a bypass capacitor.

Figure 2A:
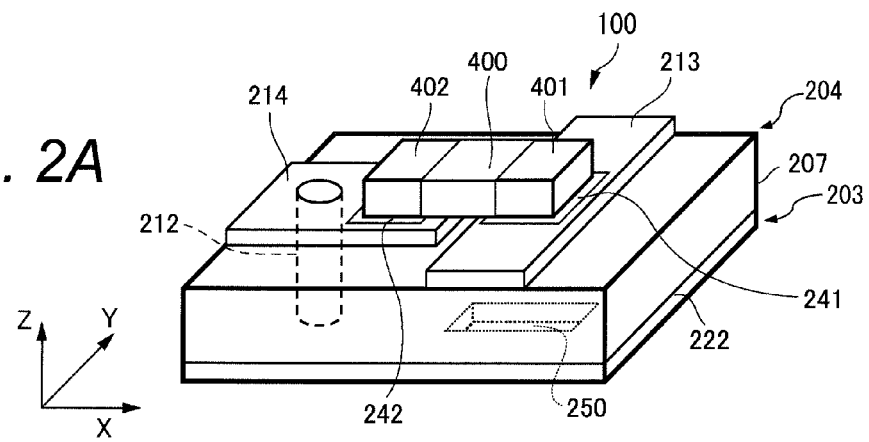
FIGS. 2A, 2B and 2C are explanatory diagrams of a main portion of the printed circuit board according to the first embodiment.
Figure 2B:
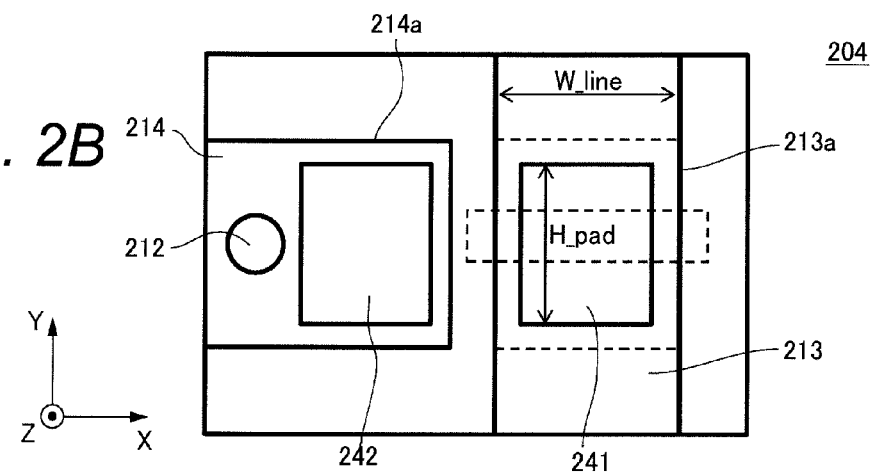
Figure 2C:
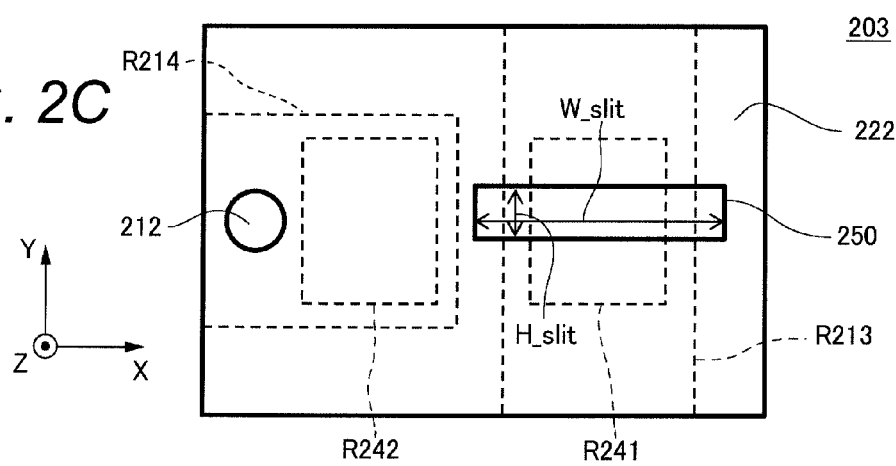

FIGS. 2A to 2C are explanatory diagrams of a main portion of the printed circuit board 100 according to the first embodiment of the present invention. FIG. 2A is a perspective diagram of the printed circuit board 100. FIG. 2B is a plan view illustrating the conductor layer (first conductor layer) 204 of the printed wiring board 200. FIG. 2C is a plan view illustrating the conductor layer (second conductor layer) 203 of the printed wiring board 200. Note that, FIGS. 2A to 2C are diagrams when the printed circuit board 100 is viewed from below in FIG. 1. In FIGS. 2A to 2C, the direction of the arrow X and the direction of the arrow Y are orthogonal to each other along the surfaces of the printed wiring board 200. The direction of the arrow Z is orthogonal to the direction of the arrow X and the direction of the arrow Y, that is, a lamination direction of the conductor layers of the printed wiring board 200.

The power supply conductor pattern 213, which is arranged on the conductor layer 204 serving as the first conductor layer, is electrically connected to the power supply terminal 301 of the semiconductor package $300_1$ (or the semiconductor package $300_2$) through the power supply via conductor 211 (FIG. 1) and the like.

The ground conductor pattern 214 serving as the first ground conductor pattern is arranged on the conductor layer 204 so as to be spaced apart from the power supply conductor pattern 213. The ground conductor pattern 214 is electrically connected to the ground terminal 302 of the semiconductor package $300_1$ (or the semiconductor package $300_2$) through the ground via conductor 212 and the like.

The ground conductor pattern 222 serving as the second ground conductor pattern is arranged on the conductor layer 203 serving as the second conductor layer so as to be opposed to the power supply conductor pattern 213 and the ground conductor pattern 214. Then, the ground conductor pattern 222 is electrically connected to the ground conductor pattern 214 through the ground via conductor 212.

The power supply conductor pattern 213 includes a power supply pad 241 on which the terminal 401 of the capacitor 400 is to be bonded. The ground conductor pattern 214 includes a ground pad 242 on which the terminal 402 of the capacitor 400 is to be bonded. The conductor layer 204 has a solder resist (not shown) formed thereon, and openings of the solder resist are formed on the conductor patterns 213 and 214, to thereby form the pads 241 and 242.

Each of the pads 241 and 242 is formed to have an area equal to or larger than the area of a bonding surface of the terminal 401 or 402 of the capacitor 400. Then, the terminals 401 and 402 of the capacitor 400 are bonded on the pads 241 and 242, respectively, by solder.

Now, a projection portion defined by projecting the power supply pad 241 onto the ground conductor pattern 222 (conductor layer 203) in the lamination direction of the printed wiring board 200 (direction of arrow Z) is represented by R241. A projection portion defined by projecting the ground pad 242 onto the ground conductor pattern 222 (conductor layer 203) in the lamination direction of the printed wiring board 200 (direction of arrow Z) is represented by R242. A projection portion defined by projecting the power supply conductor pattern 213 onto the ground conductor pattern 222 (conductor layer 203) in the lamination direction of the printed wiring board 200 (direction of arrow Z) is represented by R213. A projection portion defined by projecting the ground conductor pattern 214 onto the ground conductor pattern 222 (conductor layer 203) in the lamination direction of the printed wiring board 200 (direction of arrow Z) is represented by R214.

In the first embodiment, a slit 250 is formed in the ground conductor pattern 222 so as to pass through the projection portion R241 and divide the projection portion R213. The slit 250 is formed into substantially a rectangle when viewed from the direction of the arrow Z.

The power supply conductor pattern 213 includes a component mounting region 213a that is adjacent to an end portion 214a of the ground conductor pattern 214 and extends in the direction of the arrow Y. The direction of the arrow Y is a longitudinal direction (wiring direction) of the power supply conductor pattern 213, and is also a width direction of the end portion 214a of the ground conductor pattern 214. The component mounting region 213a is formed so that a width W_line thereof in the direction of the arrow X may be constant over the direction of the arrow Y.

Note that, in the first embodiment, the entire power supply conductor pattern 213 is formed into a strip shape extending in the direction of the arrow Y.

At least the end portion 214a (in the first embodiment, whole) of the ground conductor pattern 214 is formed into a strip shape. Then, the ground conductor pattern 214 is formed to extend in a direction intersecting with the direction of the arrow Y in which the component mounting region 213a extends (in direction of arrow X orthogonal to direction of arrow Y).

Then, the slit 250 is formed to extend in the direction intersecting with the direction of the arrow Y in which the component mounting region 213a extends (in direction of arrow X orthogonal to direction of arrow Y).

The power supply pad 241 is formed into a rectangular shape in which the width in the direction of the arrow X is set to be equal to or less than the width W_line of the component mounting region 213a of the power supply conductor pattern 213. Note that, the ground pad 242 is formed into substantially the same shape with substantially the same area as the power supply pad 241.

H_pad represents a width of the power supply pad 241 in the direction of the arrow Y. W_slit represents a width of the slit 250 in the direction of the arrow X. H_slit represents a width of the slit 250 in the direction of the arrow Y.

The width W_slit of the slit 250 is formed to be larger than the width W_line of the component mounting region 213a of the power supply conductor pattern 213. The width H_slit of the slit 250 is equal to or less than the width H_pad of the power supply pad 241.

According to the configuration described above, the inductance of the power supply conductor pattern 213 is increased at a portion of the power supply pad 241 on which the terminal 401 of the capacitor 400 is bonded (portion opposed to the slit 250). The reason is because the slit 250 divides the projection portion R213 of the power supply conductor pattern 213 to block a return current that otherwise flows in the ground conductor pattern 222 as a pair with a noise current flowing in the power supply conductor pattern 213.

Then, the slit 250 passes through the projection portion R241 of the power supply pad 241 to divide the projection portion R241. Consequently, power supply noise blocked by the slit 250 from flowing is more likely to flow to the capacitor 400 in the direction from the power supply pad 241 along the slit 250.

In this case, a parasitic inductance occurs in the capacitor 400 to no small extent in terms of structure. The inductance of the power supply conductor pattern 213 generated by the slit 250 has a value larger than that of the parasitic inductance of the capacitor 400. Thus, high-frequency power supply noise is bypassed to the ground conductor pattern 214 through the capacitor 400.

It follows that high-frequency power supply noise generated from any direction in the direction of the arrow Y in which the power supply conductor pattern 213 extends is suppressed from being propagated from one side of the power supply conductor pattern 213 in the direction of the arrow Y to the other side thereof across the power supply pad 241. In particular, by arranging the slit 250 so as to pass through the center of the projection portion R241 of the power supply pad 241 in the direction of the arrow Y and equally divide the projection portion R241, the propagation of power supply noise can be suppressed more effectively.

In this manner, the overall inductance of the power supply pad 241 in the width direction (direction of arrow X) of the power supply conductor pattern 213 is increased, and hence power supply potential fluctuations (power supply noise) are efficiently guided to the capacitor 400. Consequently, the propagation suppression effect for power supply noise is improved.

The slit 250 is formed so that one end thereof does not reach the projection portion R242 of the ground pad 242. In other words, the slit 250 is formed to extend in the direction of the arrow X toward the projection portion R242 to a position not overlapped with the projection portion R242. Consequently, the stability of the ground conductor pattern 214 on the ground pad side can be maintained.

In this manner, according to the first embodiment, the slit 250 having the width W_slit exceeding the width W_line of the power supply conductor pattern is formed in the ground conductor pattern 222, and hence the inductance of the power supply conductor pattern 213 is increased.

Inductive coupling between the power supply pad 241 and the ground conductor pattern 222 is weakened, and coupling between the power supply pad 241 and the internal capacitance of the capacitor 400 can be increased. This configuration can enhance the effect of bypassing high-frequency power supply noise to the ground conductor pattern 214 through the capacitor 400, and can thereby suppress the propagation of high-frequency power supply noise.

In addition, the power supply pad 241 does not need to be divided into two parts unlike the related art, and hence a sufficient area can be secured to facilitate the bonding of the terminal 401 of the capacitor 400.

Figure 3:
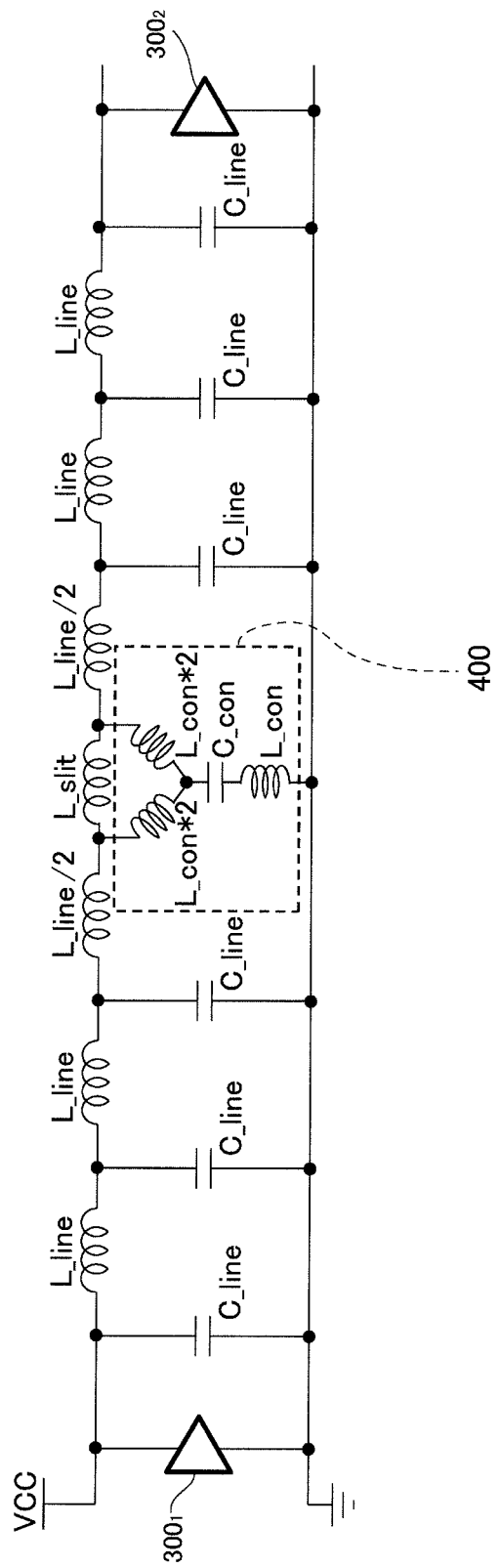
FIG. 3 is a circuit diagram illustrating an equivalent circuit of the printed circuit board according to the first embodiment.

FIG. 3 is a circuit diagram illustrating an equivalent circuit of the printed circuit board according to the first embodiment of the present invention. In FIG. 3, a power supply conductor to be applied with a power supply voltage VCC and a ground conductor are connected between the semiconductor package $300_1$ and the semiconductor package $300_2$. L_line represents an inductance component of the power supply conductor, and C_line represents a capacitance component between the power supply conductor and the ground conductor.

The capacitor 400 is connected in the middle of the power supply conductor. The capacitor 400 has an internal capacitance C_con and a parasitic inductance L_con. L_slit represents an increased amount of the inductance of the power supply conductor due to the formation of the slit 250 in the ground conductor pattern 222 that is opposed to the power supply pad 241 on which the capacitor 400 is bonded.

Parasitic inductances of the capacitor 400 on the power supply side and the ground side are each represented by L_con.

When the parasitic inductance on the power supply pad side is regarded as two parallel-connected circuits separated by the slit 250, the parasitic inductance on the power supply pad side can be represented by a parallel connection of inductances (L_con×2) twice the inductance L_con.

The slit 250 is formed in the middle of the wiring, and hence the inductances of the power supply conductors on both sides of the slit 250 can be each represented by a half inductance (L_line/2).

Figure 12:
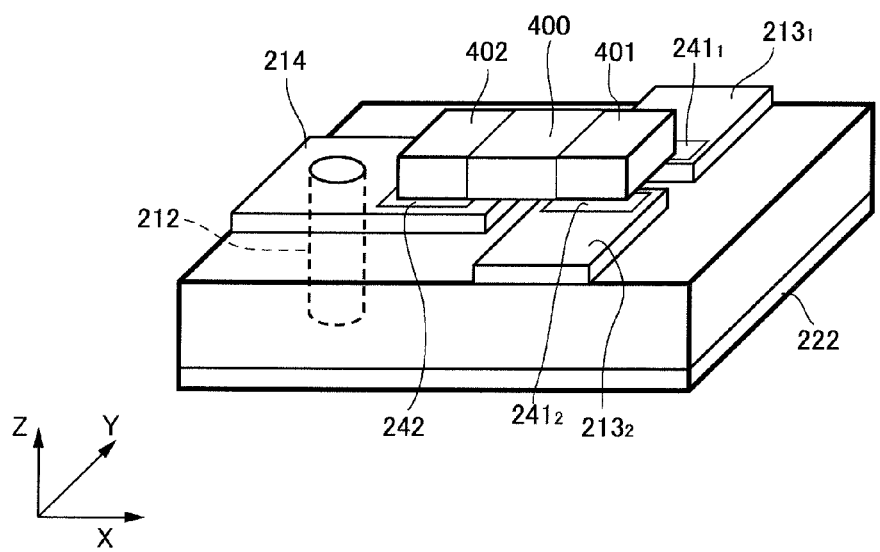
FIG. 12 is a perspective diagram illustrating the printed circuit board according to the comparative example.

Now, FIG. 12 is a perspective diagram illustrating a printed circuit board according to a comparative example. The printed circuit board according to the comparative example illustrated in FIG. 12 differs from the first embodiment illustrated in FIG. 1 in that no slit is formed in the ground conductor pattern 222 and that the power supply conductor pattern is divided into two power supply conductor patterns $213_1$ and $213_2$. The other configurations are the same as those in the first embodiment, and hence a description thereof is omitted. The power supply conductor patterns $213_1$ and $213_2$ include power supply pads $241_1$ and $241_2$, respectively, on which the terminal 401 of the same capacitor 400 is to be bonded by solder.

Figure 13:
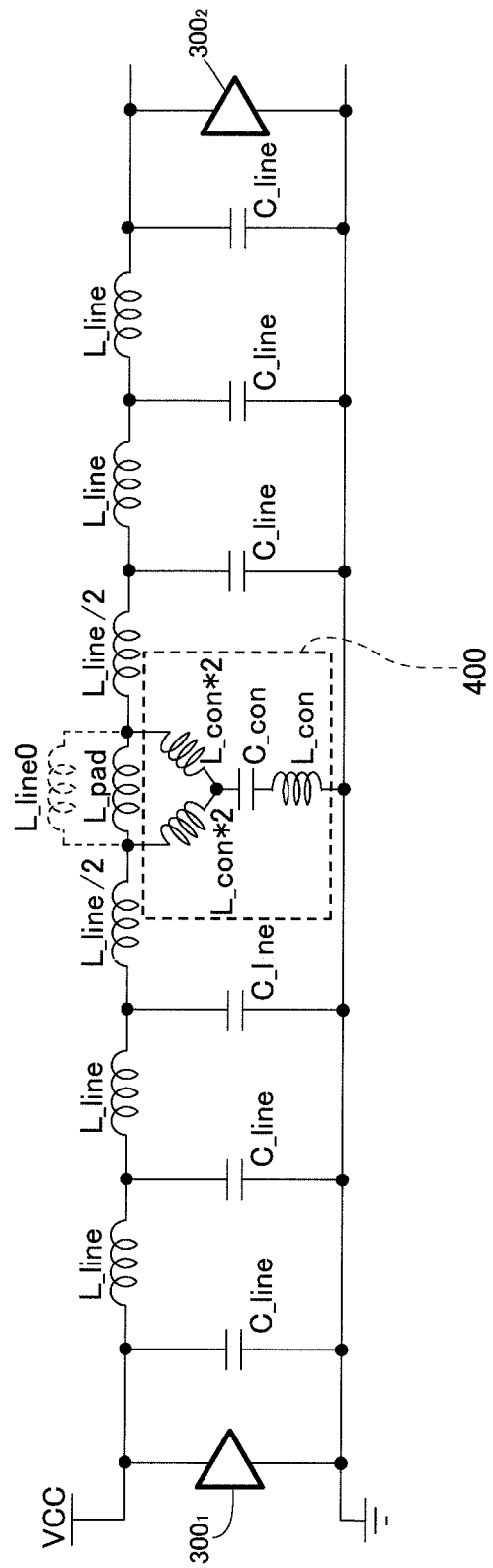
FIG. 13 is a circuit diagram illustrating an equivalent circuit of the printed circuit board according to the comparative example.

FIG. 13 is a circuit diagram illustrating an equivalent circuit of the printed circuit board according to the comparative example. In FIG. 13, a power supply conductor to be applied with a power supply voltage VCC and a ground conductor are connected between the semiconductor package $300_1$ and the semiconductor package $300_2$. L_line represents an inductance component of the power supply conductor, and C_line represents a capacitance component between the power supply conductor and the ground conductor. The capacitor 400 is connected in the middle of the power supply conductor. The capacitor 400 has an internal capacitance C_con and a parasitic inductance L_con.

A general connection portion at which the capacitor 400 is mounted is a parallel connection of an inductance L_pad of an electrode pad of the capacitor 400 and an inductance L_line0 of wiring. The comparative example shows the structure in which power supply wiring is removed from the power supply pad on which the capacitor 400 is bonded so as to remove a noise component that leaks from the inductance L_line0 of the power supply wiring at this portion.

Figure 4:
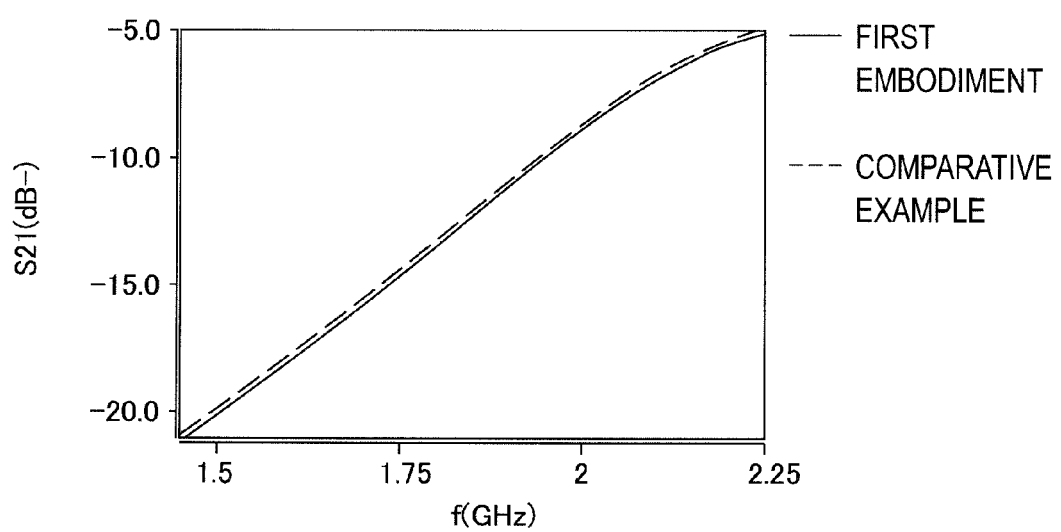
FIG. 4 is a graph showing a comparison between transmission characteristics of the printed circuit board according to the first embodiment and transmission characteristics of a printed circuit board according to a comparative example of the present invention.

FIG. 4 is a graph showing a comparison between transmission characteristics of the printed circuit board according to the first embodiment and transmission characteristics of the printed circuit board according to the comparative example. The transmission characteristics of the printed circuit board according to the first embodiment shown by the solid line in the graph were determined by electromagnetic field simulation using HFSS manufactured by ANSYS, Inc. In a simulation model, the capacitor 400 illustrated in FIG. 2A was a series connection of a parasitic inductance of 0.3 nH and a capacitance of 0.1 µF. The insulator layer 207 had a thickness of 60 µm and a relative permittivity of 4.3. The conductor pattern 213 illustrated in FIG. 2B had a width W_line of 0.7 mm, a wiring length of 5 mm, and a thickness of 35 µm, and was made of copper. The power supply pad 241 had a width H_pad of 0.6 mm and a width in the direction of the arrow X of 0.45 mm, and was made of copper. The slit 250 illustrated in FIG. 2C had a width W_slit of 0.7 mm and a width H_slit of 0.1 mm. The ground conductor pattern 222 having the slit 250 had a thickness of 35 µm and was made of copper. Those members were modeled in three dimensions, and ports were connected to both ends of the conductor pattern 213.

In a simulation model of the printed circuit board according to the comparative example shown by the broken line in the graph, the capacitor 400 was a series connection of a parasitic capacitance of 0.3 nH and a capacitance of 0.1 µF. The insulator layer 207 had a thickness of 60 µm and a relative permittivity of 4.3. Each of the power supply conductor patterns $213_1$ and $213_2$ had a width W_line of 0.7 mm, a wiring length of 2.45 mm, and a thickness of 35 µm, and was made of copper. The power supply conductor pattern $213_1$ and the power supply conductor pattern $213_2$ were spaced apart from each other by 0.1 mm. The power supply pad 241 had a width in the direction of the arrow X of 0.6 mm and a width in the direction of the arrow Y of 0.45 mm, and was made of copper. The ground conductor pattern 222 without any slit had a thickness of 35 µm and was made of copper. Those members were modeled in three dimensions, and ports were connected on substrate end sides of the power supply conductor patterns $213_1$ and $213_2$.

In FIG. 4, the solid line represents transmission characteristics (S21) as an S-parameter of the printed circuit board according to the first embodiment of the present invention. The broken line represents transmission characteristics (S21) as an S-parameter of the printed circuit board according to the comparative example.

As apparent from FIG. 4, the slit 250 formed in the ground conductor pattern 222 can further enhance the effect of bypassing high-frequency power supply noise by the capacitor 400.

As described above, according to the printed circuit board 100 of the first embodiment, the slit 250 formed in the ground conductor pattern 222 can further enhance the effect of bypassing high-frequency power supply noise by the capacitor 400. This configuration can enhance the effect of suppressing the propagation of high-frequency power supply noise generated in the semiconductor package $300_1$ (or the semiconductor package $300_2$) to another semiconductor device. For example, this configuration can enhance the effect of suppressing the propagation of high-frequency power supply noise between the semiconductor package $300_1$ and the semiconductor package $300_2$.

Note that, when a plurality of the slits 250 and the capacitors 400 having the above-mentioned structures are provided, the effect of suppressing the propagation of high-frequency power supply noise can be further enhanced.

In the first embodiment, the shape of the slit 250 is rectangular, but the slit 250 is not limited to this shape. The slit may have any shape that horizontally divides the projection portions R241 and R213 of the ground conductor pattern 222 defined by opposed projection of the power supply pad 241 and the power supply conductor pattern 213.

In the first embodiment, the power supply conductor pattern 213 is a strip-shaped wiring. Alternatively, however, the present invention is sufficiently effective even for the configuration as disclosed in PTL 1 in which the power supply wiring pattern is divided into two parts, and one of the two terminals of the capacitor is connected across the two parts of the power supply wiring while the other terminal is connected to ground wiring.

The terms "power supply" and "ground" in the power supply terminal 301 and the ground terminal 302, the power supply pad 241 and the ground pad 242, the power supply conductor pattern 213 and the ground conductor pattern 214, and the power supply via conductor 211 and the ground via conductor 212 in the first embodiment may be reversed. In this case, the ground conductor pattern 222 serving as the second ground conductor pattern is replaced by a second power supply conductor pattern.

Second Embodiment

Figure 5A:
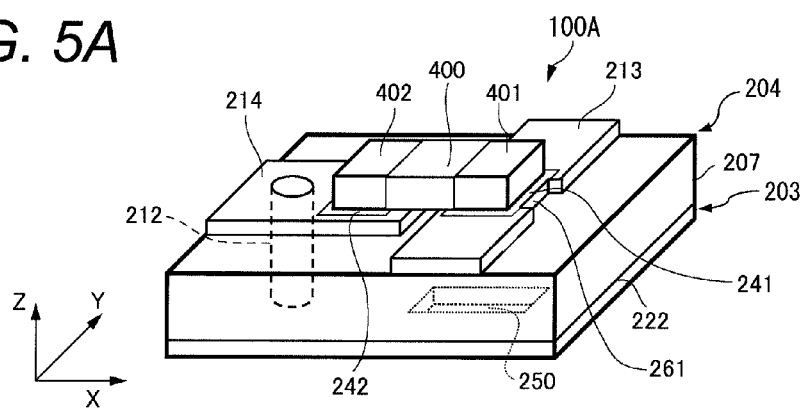
FIGS. 5A, 5B and 5C are explanatory diagrams of a main portion of a printed circuit board according to a second embodiment of the present invention.
Figure 5B:
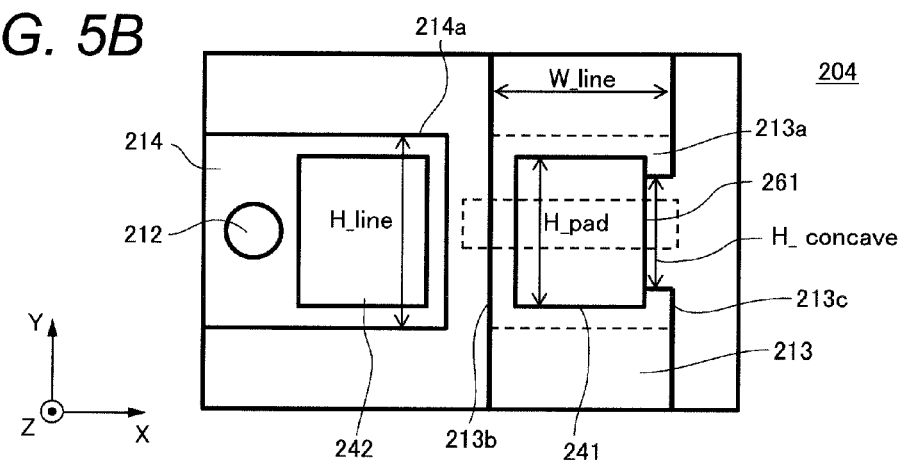
Figure 5C:
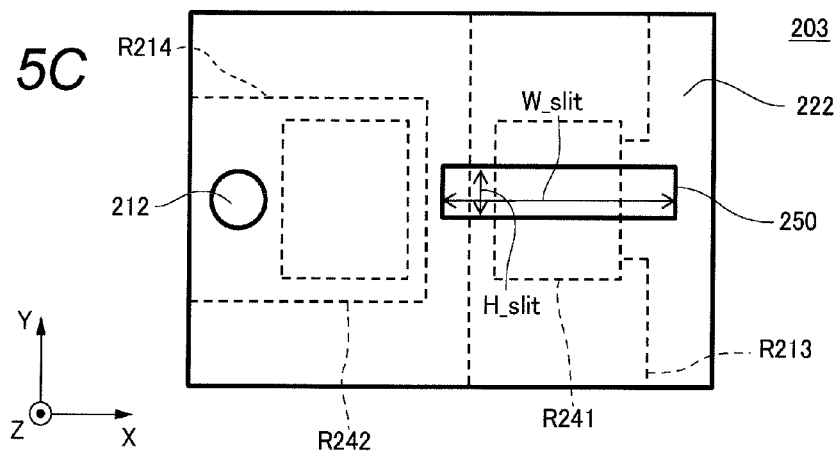

Next, a description is given of a printed circuit board according to a second embodiment of the present invention. FIGS. 5A to 5C are explanatory diagrams of a main portion of the printed circuit board according to the second embodiment of the present invention. FIG. 5A is a perspective diagram of the printed circuit board. FIG. 5B is a plan view illustrating a first conductor layer of the printed wiring board. FIG. 5C is a plan view illustrating a second conductor layer of the printed wiring board. A printed circuit board 100A according to the second embodiment differs from the above-mentioned first embodiment in that a notch portion (recessed portion) 261 is formed in another side portion 213*c* of the component mounting region 213*a*, which is on the side opposite to one side portion 213*b* thereof opposed to the end portion 214*a* of the ground conductor pattern 214. The notch portion 261 is arranged at the position opposed to the slit 250. Note that, in the printed circuit board 100A according to the second embodiment, the same components as those in the printed circuit board 100 according to the above-mentioned first embodiment are denoted by the same reference symbols, and a description thereof is omitted.

In FIG. 5B, H_concave represents a width in the direction of the arrow Y of the notch portion 261 formed in the component mounting region 213a of the power supply conductor pattern 213. H_line represents a width in the direction of the arrow Y of the end portion 214a of the ground conductor pattern 214.

By forming the notch portion 261 in the component mounting region 213a, the power supply conductor pattern 213 is thin at a portion opposed to the slit 250. When the power supply conductor pattern 213 is thin, the inductance of the power supply conductor pattern 213 is increased. Consequently, the effect of bypassing high-frequency power supply noise by the capacitor 400 can be further enhanced. Due to the slit 250, a high-frequency signal is more likely to flow in the power supply conductor pattern 213 in the direction toward the ground conductor pattern 214, and hence the effect of bypassing high-frequency power supply noise by the capacitor 400 can be further enhanced.

In the second embodiment, the width H_concave of the notch portion 261 is equal to or more than the width H_slit of the slit 250 and equal to or less than the width H_line of the end portion 214a of the ground conductor pattern 214 (equal to or less than the wiring width). When the width H_concave of the notch portion 261 is smaller than the width H_slit of the slit 250, the effect of bypassing high-frequency power supply noise by the capacitor 400 due to the slit 250 becomes dominant. Accordingly, the effect obtained by the notch portion 261 is almost eliminated. Even when the width H_concave of the notch portion 261 is larger than the width H_line of the end portion 214a of the ground conductor pattern 214, the effect of bypassing high-frequency power supply noise by the capacitor 400 is hardly changed. On the contrary, the inductance of the entire power supply conductor pattern 213 is increased, which is responsible for a voltage drop or the like.

This configuration can further enhance the effect of bypassing high-frequency power supply noise by the capacitor 400.

Figure 6:
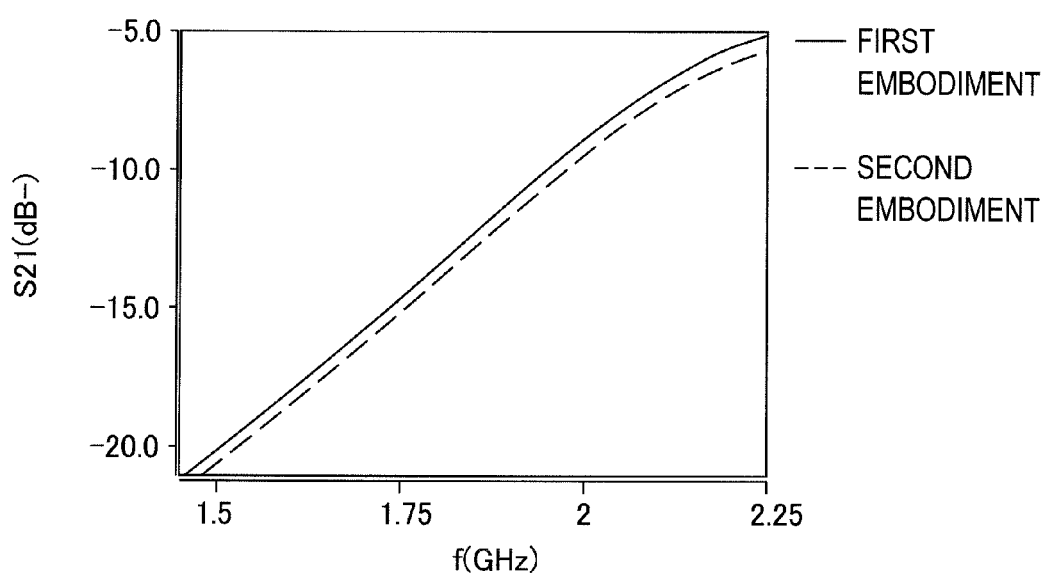
FIG. 6 is a graph showing a comparison between transmission characteristics of the printed circuit board according to the second embodiment and the transmission characteristics of the printed circuit board according to the first embodiment.

FIG. 6 is a graph showing a comparison between transmission characteristics of the printed circuit board according to the second embodiment and the transmission characteristics of the printed circuit board according to the first embodiment. In FIG. 6, the solid line represents the transmission characteristics (S21) as the S-parameter of the printed circuit board according to the first embodiment. The broken line represents transmission characteristics (S21) as an S-parameter of the printed circuit board according to the second embodiment. As apparent from FIG. 6, by forming the notch portion 261, the effect of bypassing high-frequency power supply noise by the capacitor 400 can be further enhanced.

According to the second embodiment, by forming the notch portion 261, the width W_slit of the slit 250 can be suppressed to be small as well. Thus, this configuration is effective also for downsizing of the printed circuit board 100A.

In this manner, according to the printed circuit board 100A of the second embodiment, by forming the notch portion 261 in the power supply conductor pattern 213, the effect of bypassing high-frequency power supply noise by the capacitor 400 can be further enhanced. This configuration can further enhance the effect of suppressing the propagation of high-frequency power supply noise.

The increased inductance of the power supply conductor pattern 213 can further weaken the inductive coupling between the power supply pad 241 and the ground conductor pattern 222. Thus, the coupling between the power supply pad 241 and the internal capacitance of the capacitor 400 can be further increased, and hence the effect of bypassing high-frequency power supply noise by the capacitor 400 can be further enhanced. Consequently, this configuration can further enhance the effect of suppressing the propagation of high-frequency power supply noise.

Third Embodiment

Figure 7A:
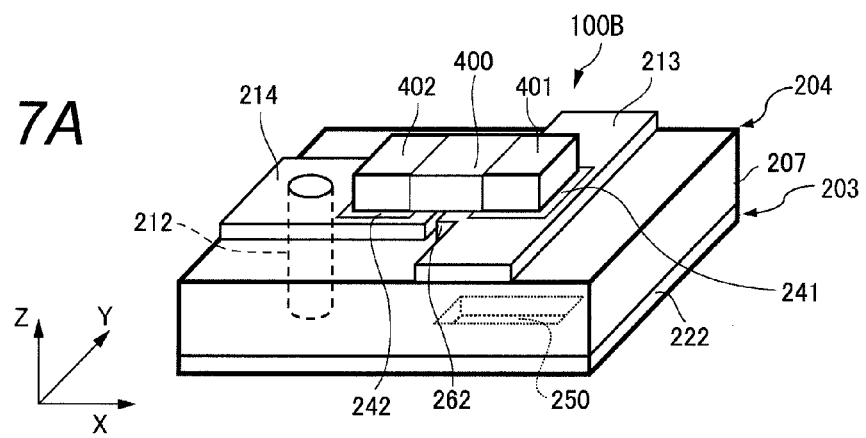
FIGS. 7A, 7B and 7C are explanatory diagrams of a main portion of a printed circuit board according to a third embodiment of the present invention.
Figure 7B:
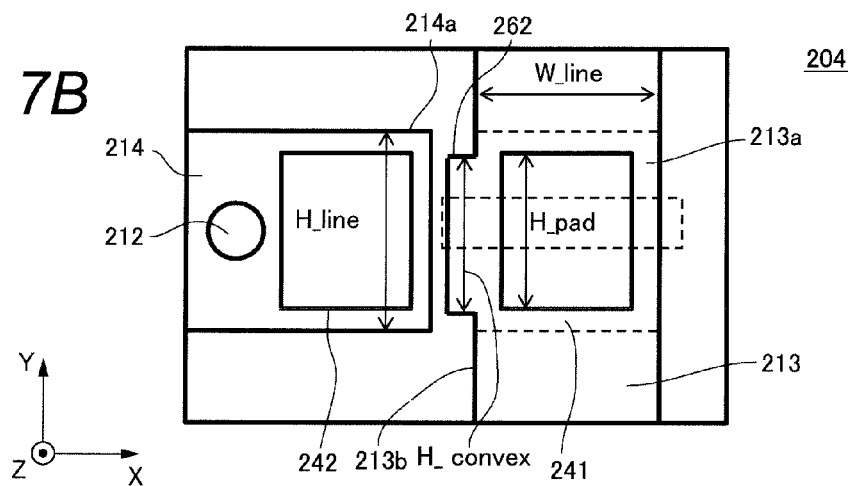
Figure 7C:
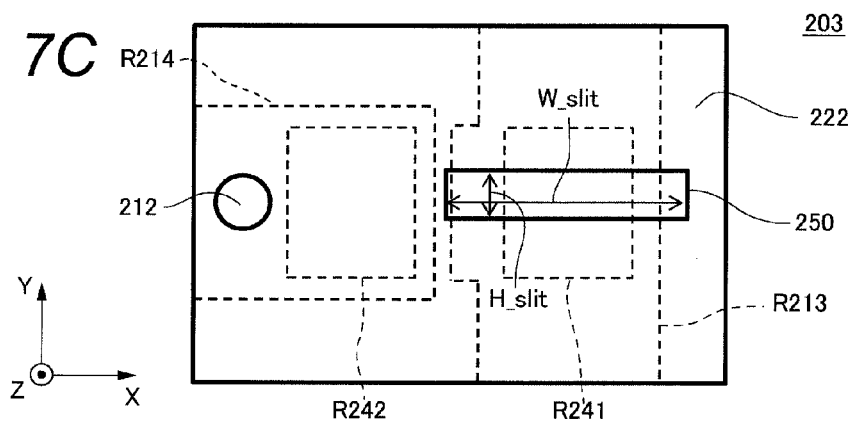

Next, a description is given of a printed circuit board according to a third embodiment of the present invention. FIGS. 7A to 7C are explanatory diagrams of a main portion of the printed circuit board according to the third embodiment of the present invention. FIG. 7A is a perspective diagram of the printed circuit board. FIG. 7B is a plan view illustrating a first conductor layer of the printed wiring board. FIG. 7C is a plan view illustrating a second conductor layer of the printed wiring board. A printed circuit board 100B according to the third embodiment differs from the above-mentioned first embodiment in that a protruding portion 262 is formed in the one side portion 213b of the component mounting region 213a, which is opposed to the end portion 214a of the ground conductor pattern 214. The protruding portion 262 is arranged at the position opposed to the slit 250. Note that, in the printed circuit board 100B according to the third embodiment, the same components as those in the printed circuit board 100 according to the above-mentioned first embodiment are denoted by the same reference symbols, and a description thereof is omitted.

In FIG. 7B, H_convex represents a width in the direction of the arrow Y of the protruding portion 262 formed in the component mounting region 213a of the power supply conductor pattern 213. H_line represents a width in the direction of the arrow Y of the end portion 214a of the ground conductor pattern 214.

By forming the protruding portion 262 in the component mounting region 213a, the power supply conductor pattern 213 becomes closer to the ground conductor pattern 214. Accordingly, the parasitic capacitance generated between the power supply conductor pattern 213 and the ground conductor pattern 214 is increased, and a high-frequency bypass circuit is formed between the power source and the ground and in parallel to the capacitor 400. Thus, the effect of bypassing power supply noise to the ground conductor pattern 214 is enhanced. Consequently, the propagation of high-frequency power supply noise in the power supply conductor pattern 213 can be effectively suppressed. Due to the protruding portion 262, a high-frequency signal is more likely to flow in the power supply conductor pattern 213 in the direction toward the ground conductor pattern 214, and hence the effect of bypassing high-frequency power supply noise by the capacitor 400 can be further enhanced. Note that, the inductance of the power supply conductor pattern 213 is slightly reduced.

In the third embodiment, the width H_convex of the protruding portion 262 is equal to or more than the width H_slit of the slit 250 and equal to or less than the width H_line of the end portion 214a of the ground conductor pattern 214 (equal to or less than the wiring width). This configuration can more effectively increase the parasitic capacitance generated between the power supply conductor pattern 213 and the ground conductor pattern 214, and can more effectively suppress the propagation of high-frequency power supply noise in the power supply conductor pattern 213.

Figure 8:
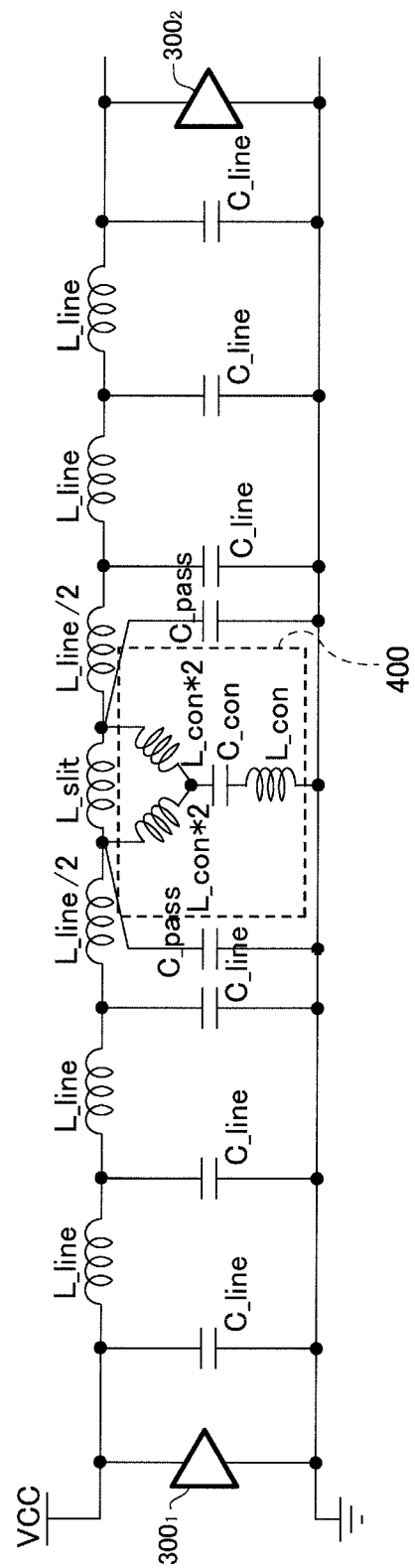
FIG. 8 is a circuit diagram illustrating an equivalent circuit of the printed circuit board according to the third embodiment.

FIG. 8 is a circuit diagram illustrating an equivalent circuit of the printed circuit board according to the third embodiment of the present invention. In FIG. 8, C_pass represents a parasitic capacitance between the protruding portion 262 formed in the vicinity of the power supply pad 241 and the ground conductor pattern 214. The parasitic capacitance C_pass becomes larger as the protruding portion 262 becomes closer to the ground conductor pattern 214.

Figure 9:
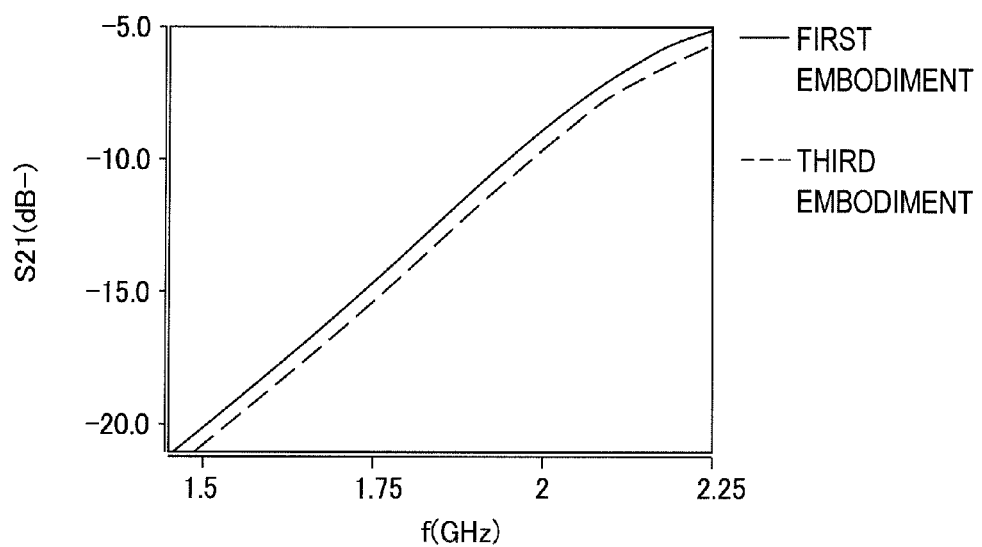
FIG. 9 is a graph showing a comparison between transmission characteristics of the printed circuit board according to the third embodiment and the transmission characteristics of the printed circuit board according to the first embodiment.

FIG. 9 is a graph showing a comparison between transmission characteristics of the printed circuit board according to the third embodiment and the transmission characteristics of the printed circuit board according to the first embodiment. In FIG. 9, the solid line represents the transmission characteristics (S21) as the S-parameter of the printed circuit board according to the first embodiment. The broken line represents transmission characteristics (S21) as an S-parameter of the printed circuit board according to the third embodiment.

As apparent from FIG. 9, by forming the protruding portion 262 in the vicinity of the power supply pad 241, the effect of bypassing high-frequency power supply noise to the ground conductor pattern 214 and thereby suppressing the propagation of high-frequency power supply noise can be enhanced.

In this manner, according to the printed circuit board 100B of the third embodiment, by forming the protruding portion 262 in the component mounting region 213a of the power supply conductor pattern 213, the parasitic capacitance generated between the power supply conductor pattern 213 and the ground conductor pattern 214 can be increased. Consequently, the effect of bypassing high-frequency power supply noise to the ground conductor pattern 214 can be further enhanced. This configuration can further enhance the effect of suppressing the propagation of high-frequency power supply noise.

Note that, the case where the protruding portion 262 is formed in the power supply conductor pattern 213 has been described in the third embodiment, but the present invention is not limited thereto, and a protruding portion may be formed in the ground conductor pattern 214 for the purpose of pursuing the same effects.

Fourth Embodiment

Figure 10A:
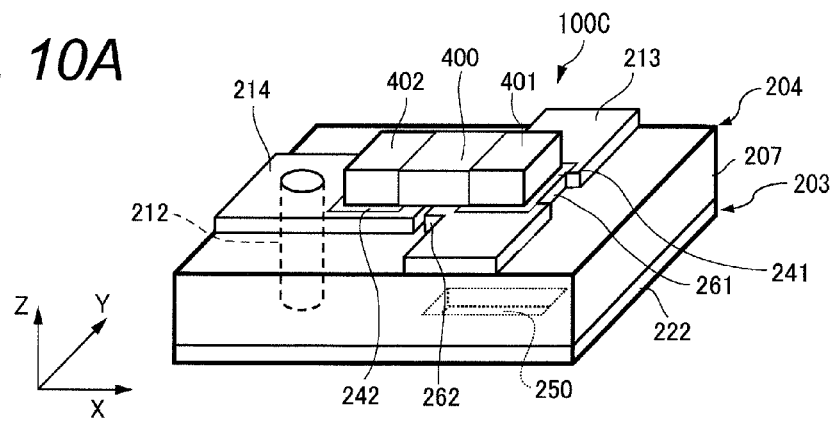
FIGS. 10A, 10B and 10C are explanatory diagrams of a main portion of a printed circuit board according to a fourth embodiment of the present invention.
Figure 10B:
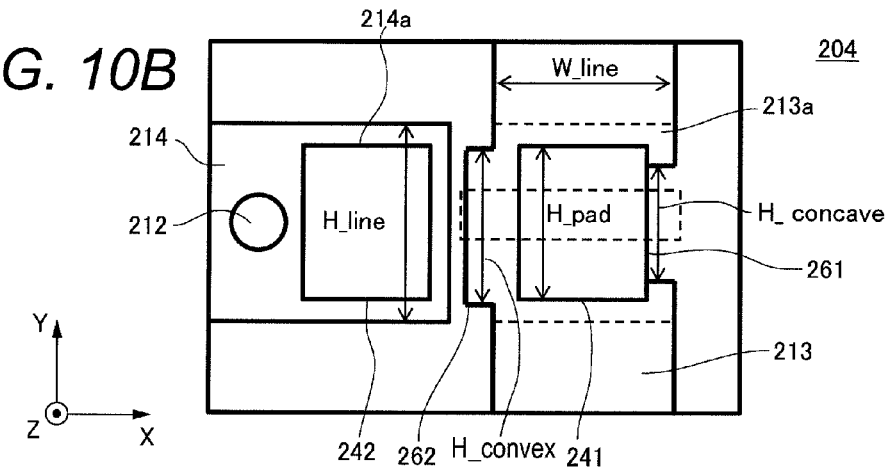
Figure 10C:
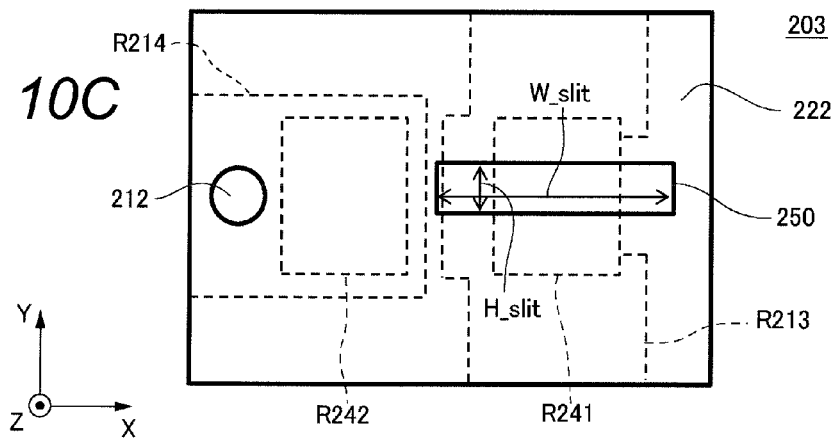

Next, a description is given of a printed circuit board according to a fourth embodiment of the present invention. FIGS. 10A to 10C are explanatory diagrams of a main portion of the printed circuit board according to the fourth embodiment of the present invention. FIG. 10A is a perspective diagram of the printed circuit board. FIG. 10B is a plan view illustrating a first conductor layer of the printed wiring board. FIG. 10C is a plan view illustrating a second conductor layer of the printed wiring board. In the printed circuit board 100C according to the fourth embodiment, the notch portion 261 is formed at the another side portion 213c of the component mounting region 213a similarly to the above-mentioned second embodiment, and the protruding portion 262 is formed at the one side portion 213b thereof. A high-frequency bypass circuit is formed between the power source and the ground and in parallel to the capacitor 400, and hence the effect of bypassing power supply noise to the ground conductor pattern 214 is enhanced. Consequently, the propagation of high-frequency power supply noise in the power supply conductor pattern 213 can be effectively suppressed. Due to the notch portion 261 and the protruding portion 262, a high-frequency signal is more likely to flow in the power supply conductor pattern 213 in the direction toward the ground conductor pattern 214, and hence the effect of bypassing high-frequency power supply noise by the capacitor 400 can be further enhanced.

In the notch portion 261 and the protruding portion 262, similarly to the above-mentioned second and third embodiments, it is preferred that the width in the direction of the arrow Y be equal to or more than the width of the slit 250 in the direction of the arrow Y and equal to or less than the width of the end portion 214a of the ground conductor pattern 214 in the direction of the arrow Y.

Figure 11:
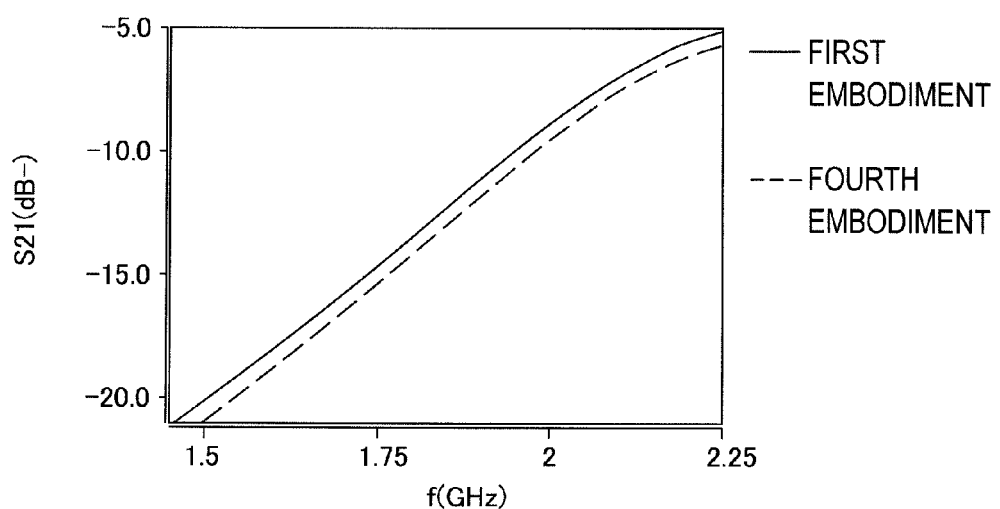
FIG. 11 is a graph showing a comparison between transmission characteristics of the printed circuit board according to the fourth embodiment and the transmission characteristics of the printed circuit board according to the first embodiment.

FIG. 11 is a graph showing a comparison between transmission characteristics of the printed circuit board according to the fourth embodiment and the transmission characteristics of the printed circuit board according to the first embodiment. In FIG. 11, the solid line represents the transmission characteristics (S21) as the S-parameter of the printed circuit board according to the first embodiment. The broken line represents transmission characteristics (S21) as an S-parameter of the printed circuit board according to the fourth embodiment.

As apparent from FIG. 11, by forming the notch portion 261 and the protruding portion 262 similar to those of the above-mentioned second and third embodiments in the component mounting region 213a of the power supply conductor pattern 213, the effect of bypassing high-frequency power supply noise to the ground conductor pattern 214 can be further enhanced.

In this manner, according to the printed circuit board 100C of the fourth embodiment, the notch portion 261 and the protruding portion 262 are formed in the vicinity of the power supply pad 241 of the power supply conductor pattern 213, and hence the parasitic capacitance can be generated as well while the inductance of the power supply conductor pattern 213 is increased. Consequently, the effect of bypassing high-frequency power supply noise can be further enhanced, and the effect of suppressing the propagation of high-frequency power supply noise can be enhanced.

Note that, the present invention is not limited to the embodiments described above, and various modifications can be made by a person having ordinary skill in the art within the technical concept of the present invention.

While what has been described above in the first to fourth embodiments is the case where the printed wiring board includes four conductor layers, the present invention is not limited thereto and is applicable to a case where the printed wiring board includes at least two conductor layers. The present invention is applicable also to a case where another conductor layer is interposed between the first conductor layer and the second conductor layer.

While what has been described above in the first to fourth embodiments is the case where the capacitor 400 is mounted on the conductor layer 204 on the side opposite to the conductor layer 201 on which the semiconductor device is mounted, the present invention is applicable also to a case where the capacitor 400 is mounted on the conductor layer 201 on which the semiconductor device is mounted.

While what has been described above in the first to fourth embodiments is the case where the power supply circuit 500 serving as a power source is mounted on the printed wiring board 200, the present invention is not limited thereto and is applicable also to a case where a DC voltage is applied from an external power source. For example, the printed wiring board may be provided with a power supply terminal (not shown) and a ground terminal (not shown) to be connected to the power supply conductor pattern 221 and the ground conductor pattern 222, respectively, and a DC voltage may be applied from an external power source through the power supply terminal and the ground terminal.

While what has been described above in the first to fourth embodiments is the case where the power supply conductor pattern 213 is not divided, the present invention is applicable also to a case where the power supply conductor pattern 213 is divided in the component mounting region 213a. In this case, as in the comparative example illustrated in FIG. 12, the terminal 401 of the capacitor 400 only needs to be bonded across the power supply pads $241_1$ and $241_2$ formed on the two power supply conductor patterns $213_1$ and $213_2$.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-149602, filed Jul. 18, 2013, which is hereby incorporated by reference herein in its entirety.

REFERENCE SIGNS LIST 100 printed circuit board, 200 printed wiring board, 203 conductor layer (second conductor layer), 204 conductor layer (first conductor layer), 211 power supply via conductor, 212 ground via conductor, 213 power supply conductor pattern, 214 ground conductor pattern (first ground conductor pattern), 222 ground conductor pattern (second ground conductor pattern), 241 power supply pad, 242 ground pad, 250 slit, $300_1$, $300_2$ semiconductor package, 301 power supply terminal, 302 ground terminal, 400 capacitor, 401 terminal (first terminal), 402 terminal (second terminal)

The invention claimed is:

1. A printed circuit board, comprising:
a semiconductor device including a power supply terminal and a ground terminal;
a capacitor including a first terminal and a second terminal; and
a printed wiring board having the semiconductor device and the capacitor mounted thereon, the printed wiring board including a first conductor layer and a second conductor layer that are laminated through an intermediation of an insulator layer,
the printed wiring board including:
a power supply conductor pattern that is arranged on the first conductor layer and is electrically connected to the power supply terminal of the semiconductor device, the power supply conductor pattern including a power supply pad on which the first terminal of the capacitor is to be bonded;
a first ground conductor pattern that is arranged on the first conductor layer so as to be spaced apart from the power supply conductor pattern and is electrically connected to the ground terminal of the semiconductor device, the first ground conductor pattern including a ground pad on which the second terminal of the capacitor is to be bonded; and
a second ground conductor pattern that is arranged on the second conductor layer so as to be opposed to the power supply conductor pattern and is electrically connected to the first ground conductor pattern,
wherein the second ground conductor pattern has a slit formed therein so as to pass through a projection portion defined by projecting the power supply pad onto the second ground conductor pattern and divide a projection portion defined by projecting the power supply conductor pattern onto the second ground conductor pattern.

2. A printed circuit board according to claim 1, wherein the slit is formed to extend toward a projection portion defined by projecting the ground pad onto the second ground conductor pattern to a position that avoids overlapping with the projection portion defined by projecting the ground pad onto the second ground conductor pattern.

3. A printed circuit board according to claim 1, wherein:
the power supply conductor pattern includes a component mounting region that is adjacent to an end portion of the first ground conductor pattern;
the power supply pad is arranged in the component mounting region of the power supply conductor pattern;
the ground pad is arranged at the end portion of the first ground conductor pattern; and
the slit is formed so as to divide, in the component mounting region, the projection portion defined by projecting the power supply conductor pattern onto the second ground conductor pattern.

4. A printed circuit board according to claim 3, wherein another side portion of the component mounting region, which is on a side opposite to one side portion thereof opposed to the end portion of the first ground conductor pattern, has a notch portion formed therein at a position opposed to the slit.

5. A printed circuit board according to claim 4, wherein a width of the notch portion in a longitudinal direction of the power supply conductor pattern is equal to or more than a width of the slit in the longitudinal direction of the power supply conductor pattern and equal to or less than a wiring width of the end portion of the first ground conductor pattern.

6. A printed circuit board according to claim 3, wherein one side portion of the component mounting region, which is opposed to the end portion of the first ground conductor pattern, has a protruding portion formed thereon at a position opposed to the slit.

7. A printed circuit board according to claim 6, wherein a width of the protruding portion in a longitudinal direction of the power supply conductor pattern is equal to or more than a width of the slit in the longitudinal direction of the power supply conductor pattern and equal to or less than a wiring width of the end portion of the first ground conductor pattern.

8. A printed circuit board according to claim 3, wherein the power supply conductor pattern is divided in the component mounting region.

9. A printed circuit board, comprising:
a semiconductor device including a power supply terminal and a ground terminal;
a capacitor including a first terminal and a second terminal; and
a printed wiring board having the semiconductor device and the capacitor mounted thereon, the printed wiring board including a first conductor layer and a second conductor layer that are laminated through an intermediation of an insulator layer,
the printed wiring board including:
a ground conductor pattern that is arranged on the first conductor layer and is electrically connected to the ground terminal of the semiconductor device, the ground conductor pattern including a ground pad on which the first terminal of the capacitor is to be bonded;
a first power supply conductor pattern that is arranged on the first conductor layer so as to be spaced apart from the ground conductor pattern and is electrically connected to the power supply terminal of the semiconductor device, the first power supply conductor pattern including a power supply pad on which the second terminal of the capacitor is to be bonded; and
a second power supply conductor pattern that is arranged on the second conductor layer so as to be opposed to the ground conductor pattern and is electrically connected to the first power supply conductor pattern,
wherein the second power supply conductor pattern has a slit formed therein so as to pass through a projection portion defined by projecting the ground pad onto the second power supply conductor pattern and divide a projection portion defined by projecting the ground conductor pattern onto the second power supply conductor pattern.

10. A printed circuit board according to claim 9, wherein the slit is formed to extend toward a projection portion defined by projecting the power supply pad onto the second power supply conductor pattern to a position that avoids overlapping with the projection portion defined by projecting the power supply pad onto the second power supply conductor pattern.

11. A printed circuit board according to claim 9, wherein:
the ground conductor pattern includes a component mounting region that is adjacent to an end portion of the first power supply conductor pattern;
the ground pad is arranged in the component mounting region of the ground conductor pattern;
the power supply pad is arranged at the end portion of the first power supply conductor pattern; and
the slit is formed so as to divide, in the component mounting region, the projection portion defined by projecting the ground conductor pattern onto the second power supply conductor pattern.

12. A printed wiring board, comprising:
a first conductor layer on which a semiconductor device and a capacitor are to be mounted,
the first conductor layer including:
a power supply conductor pattern on which a power supply terminal of the semiconductor device is to be mounted, the power supply conductor pattern including a power supply pad on which a first terminal of the capacitor is to be bonded; and
a first ground conductor pattern on which a ground terminal of the semiconductor device is to be mounted, the first ground conductor pattern being arranged to be spaced apart from the power supply conductor pattern, the first ground conductor pattern including a ground pad on which a second terminal of the capacitor is to be bonded; and
a second conductor layer,
the first conductor layer and the second conductor layer being laminated through an intermediation of an insulator layer,
the second conductor layer including a second ground conductor pattern that is arranged on the second conductor layer so as to be opposed to the power supply conductor pattern and is electrically connected to the first ground conductor pattern, wherein the second ground conductor pattern has a slit formed therein so as to pass through a projection portion defined by projecting the power supply pad onto the second ground conductor pattern and divide a projection portion defined by projecting the power supply conductor pattern onto the second ground conductor pattern.

13. A printed wiring board according to claim 12, wherein the slit is formed to extend toward a projection portion defined by projecting the ground pad onto the second ground conductor pattern to a position that avoids overlapping with the projection portion defined by projecting the ground pad onto the second ground conductor pattern.

14. A printed wiring board according to claim 12, wherein:
the power supply conductor pattern includes a component mounting region that is adjacent to an end portion of the first ground conductor pattern;
the power supply pad is arranged in the component mounting region of the power supply conductor pattern;
the ground pad is arranged at the end portion of the first ground conductor pattern; and
the slit is formed so as to divide, in the component mounting region, the projection portion defined by projecting the power supply conductor pattern onto the second ground conductor pattern.

15. A printed wiring board according to claim 14, wherein another side portion of the component mounting region, which is on a side opposite to one side portion thereof opposed to the end portion of the first ground conductor pattern, has a notch portion formed therein at a position opposed to the slit.

16. A printed wiring board according to claim 15, wherein a width of the notch portion in a longitudinal direction of the power supply conductor pattern is equal to or more than a width of the slit in the longitudinal direction of the power supply conductor pattern and equal to or less than a wiring width of the end portion of the first ground conductor pattern.

17. A printed wiring board according to claim 14, wherein one side portion of the component mounting region, which is opposed to the end portion of the first ground conductor pattern, has a protruding portion formed thereon at a position opposed to the slit.

18. A printed wiring board according to claim 17, wherein a width of the protruding portion in a longitudinal direction of the power supply conductor pattern is equal to or more than a width of the slit in the longitudinal direction of the power supply conductor pattern and equal to or less than a wiring width of the end portion of the first ground conductor pattern.

19. A printed wiring board according to claim 14, wherein the power supply conductor pattern is divided in the component mounting region.

* * * * *